United States Patent [19]
Vallet et al.

[11] 4,433,327
[45] Feb. 21, 1984

[54] APPARATUS FOR CONVERTING NUMERAL REPRESENTING DATA CODING FORMATS RECEIVED OR DERIVED BY A CENTRAL PROCESSING UNIT

[75] Inventors: Philippe M. A. Vallet, Lardy; Annie M. M. Vinot nee Ricol, Sucy-en-Brie, both of France

[73] Assignee: CII Honeywell Bull, Paris, France

[21] Appl. No.: 249,410

[22] Filed: Mar. 31, 1981

[30] Foreign Application Priority Data

Apr. 1, 1980 [FR] France ................... 80 07287

[51] Int. Cl.³ .............................................. G06F 3/00
[52] U.S. Cl. .............................. 340/347 DD; 235/310
[58] Field of Search ................ 340/347 DD; 235/310; 364/200, 900

[56] References Cited

U.S. PATENT DOCUMENTS

3,274,378  9/1966  Crawford .................... 340/347 DD
3,310,786  3/1967  Rinaldi ...................... 340/347 DD
3,324,288  6/1967  Schneberger ............... 340/347 DD
3,955,177  5/1976  Miller .
4,141,005  2/1979  Bonner ...................... 340/347 DD
4,250,548  2/1981  Kindell ........................... 364/200

FOREIGN PATENT DOCUMENTS

2371013  9/1977  France .

Primary Examiner—C. D. Miller
Attorney, Agent, or Firm—Lowe, King, Price & Becker

[57] ABSTRACT

Numeral representing signals are converted between data coding formats employed externally and internally of a central processing unit of a data processing system. By a treatment internal to the central processing unit, a numeral representing signal supplied to the unit in one of several external data coding formats is converted into a numeral representing signal having single internal data coding formed. By a treatment internal to the central processing unit, a numeral representing signal derived by the unit in the single internal data coding format is converted into a signal in a selected one of the several external data coding formats.

9 Claims, 8 Drawing Figures a b c d e f

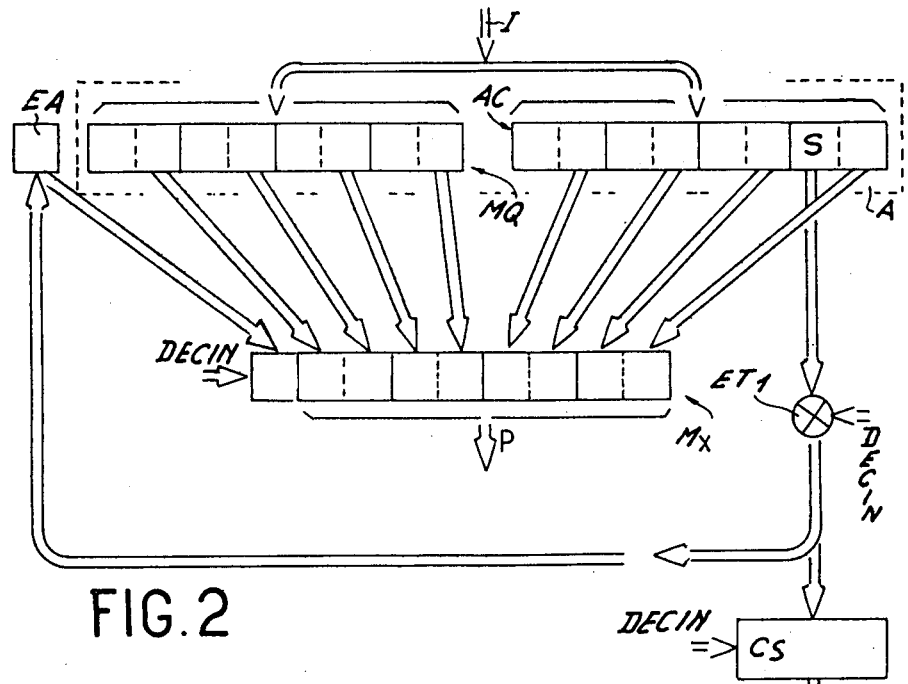
FIG.2
FIG.3
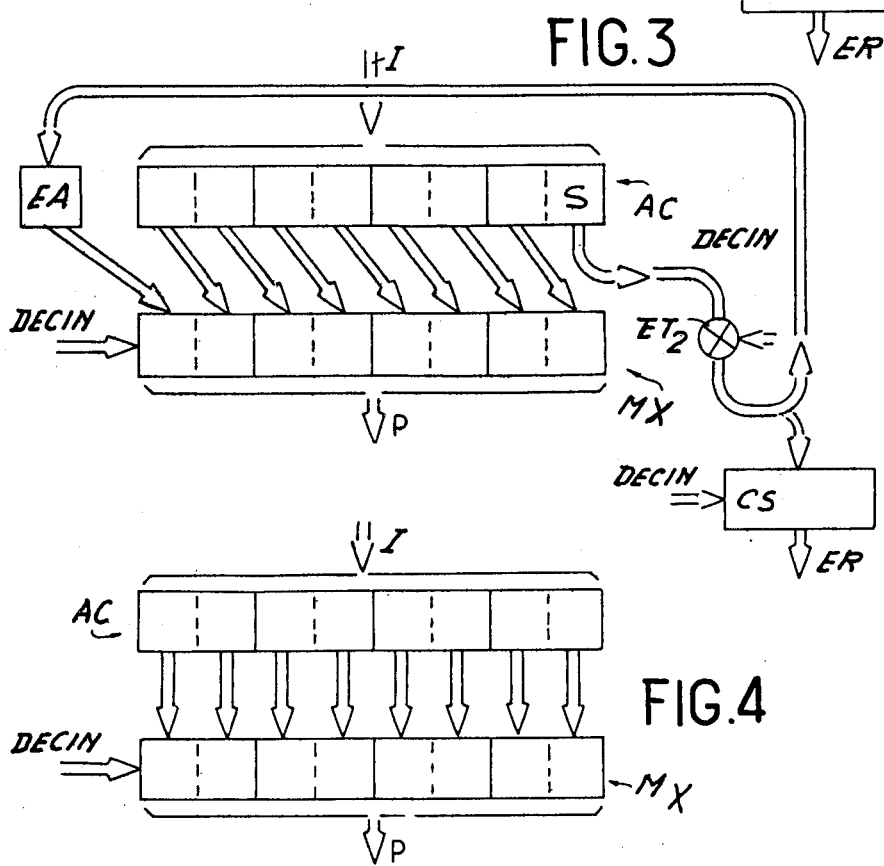
FIG.4

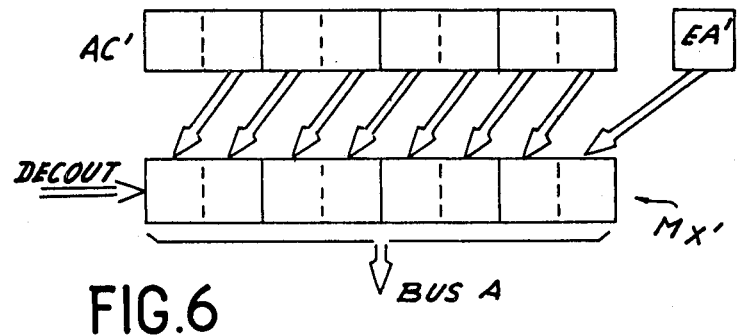
FIG.6
FIG.7
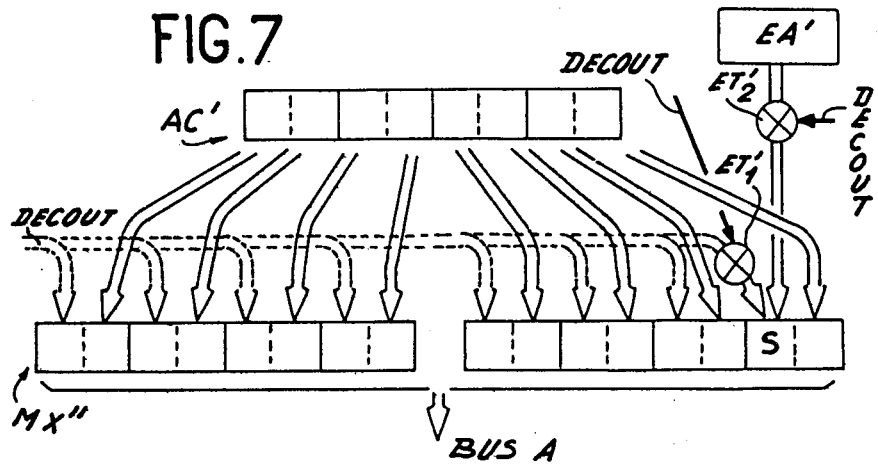
FIG.8
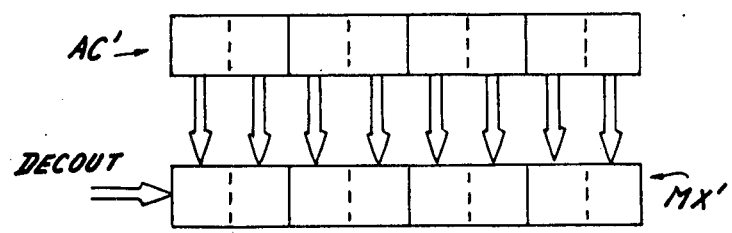

APPARATUS FOR CONVERTING NUMERAL REPRESENTING DATA CODING FORMATS RECEIVED OR DERIVED BY A CENTRAL PROCESSING UNIT

TECHNICAL FIELD

The present invention relates to an apparatus for converting numeral representing data coding formats received or derived by a data processing system and more particularly to such an apparatus wherein an external numeral data coding representing format is converted into an internal numeral representing data coding format and vice versa by treatment internal to a central processing unit of the data processing system. The invention is applicable to converting numeral representing signals received by the central processing unit in an external data coding format into numeral representing signals in an internal data coding format by a treatment internal to the central processing unit. The invention is equally applicable to converting numeral representing signals derived by the central processing unit in an internal data coding format into signals in an external data coding format by internal treatment within the central processing unit.

BACKGROUND ART

Data supplied to a central processing unit of data processing system by elements external to the central processing unit, e.g., terminals, are derived in an external data coding format but are processed by the central processing unit in an internal data coding format. Generally, a programmer who inserts data into a data processing system, handles these data in a so-called "external" data coding format which assists the programming work of the programmer. For every data processing system of which I am aware, the external data coding format differs from the internal or machine data coding format. Thus, in most data processing systems a change from an external data coding format to an internal data coding format requires a special sub-routine which is generated by a "compiler". The sub-routine enables a source program written in an evolved language to be translated into an object program written in a machine language of the central processing unit which implements the source program. The compiler generates a sub-routine for translating the data coding format which is phrased in source language by the programmer or included in input-output procedures of the data processing system. The generation of the sub-routine by the compiler lengthens the time required to insert data into the data processing system in a troublesome manner. In the same manner, signals processed by the central processing unit and available to be coupled to an output of the central processing unit, for example on a data bus, are expressed in the internal data coding format. In most cases, the data derived by the central processing unit are utilized by and supplied to an external apparatus, such as a terminal. To enable the external apparatus to use the data derived by the central processing unit, the data signals derived by the central processing unit must be translated from the internal data coding format or machine data coding format into data signals expressed in an external data coding format that corresponds with the format employed by the external apparatus. Consequently, it is necessary for a double translation to be performed at the input as well as the output of the central processing unit to enable the central processing unit to process the data signals supplied to it and to change the data signals it derives into signals which can be utilized by external apparatus. This double translation is protracted and costly.

An object of the present invention is to provide a new and improved apparatus for translating signals between a central processing unit and devices external to the central processing unit.

Another object of the invention is to provide an apparatus for translating data between a central processing unit and apparatus external to the central processing unit without employing a compiler.

A more particular object of the invention is to provide a new and improved apparatus for translating numeral representing signals between a central processing unit and apparatus external to the central processing unit wherein the central processing unit has an internal code with a signless condensed format.

Still another object of the invention is to provide an apparatus for converting numeral representing signals exchanged between a central processing unit and apparatus external to the central processing unit by treating the signals internally of the central processing unit.

Still a further object of the invention is to provide an apparatus for converting signals in an external data coding format supplied to a central processing unit by a device external to the central processing unit into signals having an internal data coding format by treating the signals internally of the central processing unit.

Still a further object of the invention is to provide an apparatus for converting signals derived by a central processing unit in an internal data coding format into signals that are supplied to a device external to the central processing unit in an external data coding format by a treatment internal to the central processing unit.

DISCLOSURE OF INVENTION

In accordance with the present invention, data signals representing numeral characters are converted between internal and external data coding formats by a treatment internal to the central processing unit. The signals received by the central processing unit in an external code are converted into signals expressed in an internal code of the central processing unit by a treatment internal to the central processing unit. The numeral representing signal characters derived by the central processing unit in an internal data coding format are converted into numeral representing signals expressed in a data coding format external to the system by a treatment internal to the central processing unit.

One of several external data coding formats may be used. In particular, the external data coding format may be any of: (1) the non-condensed signless type, (2) the non-condensed type having a sign, (3) the condensed signless type, or (4) the condensed type having a sign. The central processing unit employs a condensed internal data coding format.

An apparatus in accordance with the invention converts numeral representing signals of a data coding format that is supplied to or derived by a central processing unit. The apparatus includes means internal to the central processing unit for converting the numeral representing signals received by the central processing unit in an external data coding format into numeral representing signals expressed in an internal data coding format of the central processing unit; the converting means treats the received signals internally of the central processing unit. The apparatus also includes means internal to the central processing unit for converting the numeral representing data signals derived by the central processing unit in the internal data coding format into numeral representing signals expressed in the external data coding format; the converting means treats the characters internally of the central processing unit.

In accordance with another feature of the invention, the means internal to the central processing unit which converts the numeral representing signals supplied to the central processing unit in the external data coding format into numeral representing signals expressed in the internal data coding format comprises at least one buffer register that received the externally derived signals. The buffer register is a part of an accumulator register in the arithematic unit of the central processing unit. At least one multiplexer that functions as a gate is provided. The multiplexer has inputs connected to outputs of the buffer register. A control input of the multiplexer responds to control signals derived by a microprogram of the central processing unit. The control signal is associated with converting the numeral representing signal received by the central processing unit in the external data coding format into numeral representing signals expressed in the internal data coding format. An operator register of the central processing unit is responsive to outputs of the multiplexer to store the signals derived from the multiplexer in the internal data coding format.

According to another feature of the invention, the means internal to the central processing unit for converting the numeral representing signals derived by the central processing unit in the internal data coding format into numeral representing signals expressed in the external data coding format comprises a buffer register responsive to the signals derived by the central processing unit in the internal data coding format. A multiplexer that functions as a gate has inputs responsive to outputs of the buffer register. The multiplexer includes a control input responsive to a control signal derived by a microprogram of the central processing unit, which control signal enables numeral representing signals derived by the central processing unit in the internal data coding format to be converted into numeral representing signals expressed in the external data coding format. The output signals of the multiplexer are in the internal coding format.

The above and still further objects, features and advantages of the present invention will become apparent upon consideration of the following detailed description of several specific embodiments thereof, especially when taken in conjunction with the accompanying drawings.

BRIEF DESCRIPTION OF THE DRAWINGS

FIG. 1(f) is a schematic illustration of the configuration of a signal that may be supplied to or derived from a central processing unit utilizing the invention;

FIG. 2 is a schematic block diagram of apparatus, in accordance with the invention, included in a central processing unit, for converting a numeral representing signal in a non-condensed external data coding format into a numeral representing signal in a condensed, internal data coding format;

FIG. 3 is a schematic block diagram of an apparatus, in accordance with the present invention, included in a central processing unit, for converting a numeral representing signal in a condensed, external data coding format having a sign into a numeral representing signal in a condensed, internal data coding format;

FIG. 4 is a schematic block diagram of a converter, in accordance with the invention, included in a central processing unit, for converting a numeral representing signal in an internal condensed data coding format;

FIG. 6 is a schematic block diagram of an apparatus, in accordance with the invention, in a central processing unit, for converting a numeral representing signal in an internal condensed data coding format into a numeral representing signal in an external condensed data coding format having a sign;

FIG. 7 is a schematic block diagram of an apparatus, in accordance with the invention, in a central processing unit, for converting a numeral representing signal in an internal condensed data coding format into a numeral representing signal in an external non-condensed data coding format that may or may not have a sign; and FIG. 8 is a schematic block diagram of an apparatus, in accordance with the invention, in a central processing unit, for converting a numeral representing signal in an internal condensed data coding format into a numeral representing signal in an external condensed data coding format that does not have a sign.

BEST MODE FOR CARRYING OUT THE INVENTION

Figure 1:
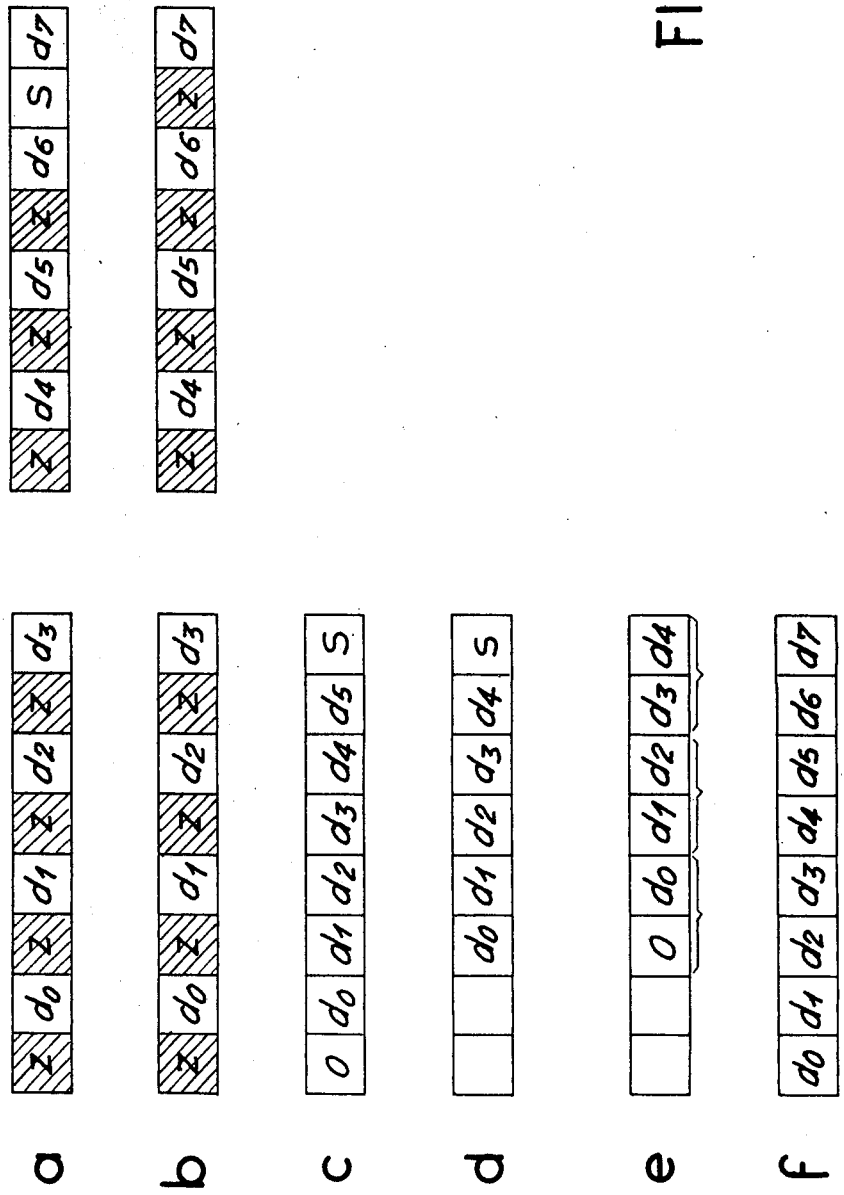
FIGS. 1 (a), (b), (c), (d), and (e) are schematic illustrations of different configurations of signals expressed in a data coding format external to a central processing unit including the present invention.

Reference is now made to FIGS. 1 (a), 1(b), 1(c), 1(d), 1(e) and 1(f) wherein there are illustrated the different configurations for numeral representing signals expressed in external data coding formats of the ASCII or the EBCDIC type, for example. The configuration illustrated in FIG. 1 may be supplied to or derived by a central processing unit including the method and apparatus of the invention.

The majority of central processing units process signals representing numeral characters that are expressed in an internal data coding format or a machine data coding format of the condensed signless type. Generally, signals expressed in the internal data coding format or the machine data coding format of the central processing unit are represented by successive multiplets. For example, signals coded in the internal data coding format are expressed by eight quartets, where one quartet includes four binary bits, i.e., signals in the internal coding format of the machine are frequently represented as thirty two bit words.

A thirty two bit, numeral representing word coded in the internal data coding format of a typical central processing unit is diagrammatically illustrated in FIG. 1(f). Such a thirty two bit word includes eight multiplets $d_0$, $d_1 \ldots d_7$ such that each multiplet is formed as a single quartet, i.e., four bits. The eight multiplets in the thirty two bit word of FIG. 1(f) are at positions representing signal values enabling a number to be expressed in the internal data coding format of the central processing unit. Thus, each of quartets $d_0$–$d_7$ represents four binary bits that can represent any of the decimal numbers from 0 to 9, inclusive. Quartet $d_0$ represents the least significant decimal place while quartet $d_7$ represents the most significant decimal place of the decimal number indicated by the signal of FIG. 1(f). The data word schematically illustrated in FIG. 1(f) also represents a signal received or derived by the central processing unit in the condensed signless external data coding format.

FIG. 1(a) is a schematic representation of a signal in a noncondensed external data coding format having a sign. The format includes a pair of successive thirty two bit words, each of which includes a like number of multiplets, each including a like number of bits. In the preferred embodiment, eight multiplets, each in the form of a quartet (four bits), is included in the format of FIG. 1(a). The first word includes quartets $d_0$, $d_1$, $d_2$ and $d_3$ while the second word includes quartets $d_4$, $d_5$, $d_6$ and $d_7$, wherein quartets $d_0$ and $d_7$ respectively represent the decimal value and the most significant decimal value of a numeral representing signal. Each word includes zone quartets Z located between adjacent ones of quartets $d_0$, $d_1$ ... $d_6$. In each of quartets $d_0$, $d_1$ ... $d_7$ are four decimal representing bits expressed in a predetermined data coding format, such as the ASCII or EBCDIC format. In quartets $d_0$, $d_1$ ... $d_7$ of FIG. 1(a) are signals corresponding with the signals at quartets $d_0$, $d_1$ ... $d_7$ of FIG. 1(f). Between quartets $d_6$ and $d_7$ of the FIG. 1(a) format is a quartet S representing a sign allocated to the numeral in quartets $d_0$, $d_1$ ... $d_7$. In a typical situation for the format of FIG. 1(a), the signals in quartets $d_0$, $d_1$ ... $d_7$ represent binary values found in rows of a given table which represent numeral characters expressed in a particular data coding format, such as the ASCII format. The signals in the quartets in zones Z represent binary values for decimal numeral values found in columns of the table.

FIG. 1(b) is a diagrammatic illustration of two thirty two bit words having a format substantially the same as the thirty two bit format of the words illustrated in FIG. 1(a). In the format of FIG. 1(b), however, sign quartet S has been replaced by a zone quartet Z.

FIG. 1(c) is a diagrammatic illustration of a thirty two bit word including eight quartets which represent a sign-affected number. The second through seventh quartets $d_0$–$d_5$ represent the first (least significant decimal place) through the sixth (most significant decimal place) numerical values of a six place decimal number. The sign is indicated by the last quartet S. The first quartet (0) enables the octet (eight quartets) to be completed; in a typical situation, the first quartet is formed by four binary bits, each having a zero value.

FIG. 1(d) is a diagrammatic illustration of number representing signal in an external data coding format including five decimal representing quartets $d_0$, $d_1$, $d_2$, $d_3$ and $d_4$, as well as a sign representing quartet S that follows quartet $d_4$. To provide a clear indication that an odd number of quartets represent decimal number values in contrast to the format of FIG. 1(c), a zero representing quartet is not derived prior to the sequence of quartets representing the five decimal places. In other words, an indication is provided that an odd number of numeral representing quartets are included in the data coding format of FIG. 1(d) providing a quartet including four zeros before quartet $d_0$. A zero quartet is not in the format of FIG. 1(d) because the format includes the sign quartet S and thereby has an even number of quartets.

FIG. 1(e) is a diagrammatic illustration of an external signal having a signless number condensed data coding format. The format of FIG. 1(e) includes five numeral representing quartets $d_0$, $d_1$, ... $d_4$. Quartet $d_0$ is preceeded by a zero quartet including four binary zero bits, so the format has an even number of quartets.

As a rule, and by way of example, the external, uncondensed data coding formats illustrated in FIG. 1 have 16 successive quartets. In contrast, the internal or external condensed data coding format includes eight successive quartets.

In accordance with the present invention, signals received by a central processing unit in any of the external data coding formats illustrated diagrammatically in FIGS. 1(a)–1(f) are converted by a treatment internal to the central processing unit into signals having an internal data coding format of the type diagrammatically illustrated in FIG. 1(f).

Figure 5:
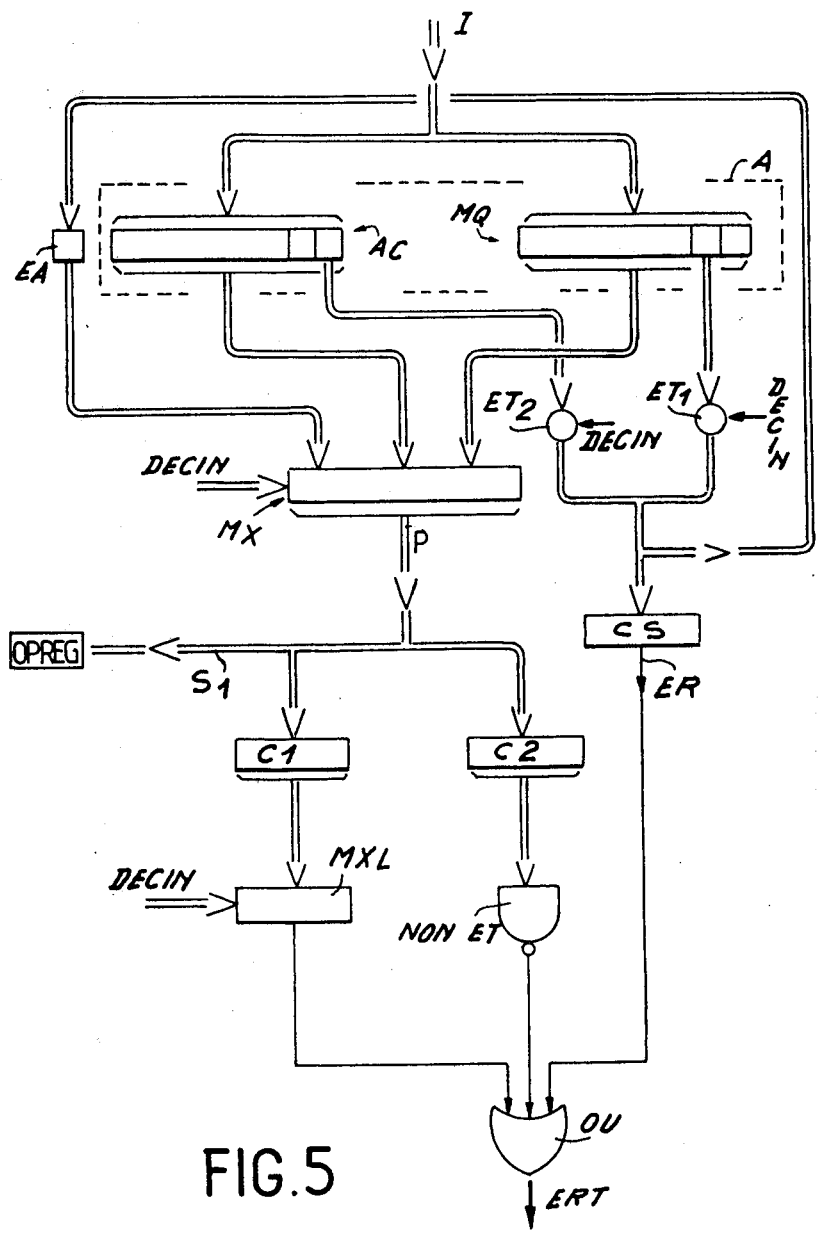
FIG. 5 is a schematic block diagram of a combination of the devices illustrated in FIGS. 2, 3, and 4 for converting a numeral representing signal in any one of three external data coding formats into a numeral representing signal in an internal condensed data coding format.

FIG. 2 is a block diagram of the apparatus, in accordance with the invention, included within a central processing unit for converting a numeral representing signal having an external non-condensed data coding format, as illustrated in FIG. 1(a) or 1(b), into an internal signal having a condensed signless coded format, as illustrated in FIG. 1(f). The signal having the external data coding format is supplied to input bus I of the central processing unit by an external device, such as a terminal or other peripheral. The central processing unit containing the apparatus of FIG. 2 and of the remaining figures, includes the usual elements, e.g., arithmetic unit, input-output unit, arithmetic unit and memory containing an operation register; none of these elements are shown in FIGS. 2–8, with the exception of an operation register OPREG which is shown in FIG. 5. The memory also includes a microprogram source which derives control signal DECIN and DECOUT; signal DECIN is supplied as a control signal to the external to internal signal converting apparatus of FIGS. 2–5, while signal DECOUT is supplied to the internal to external signal converting apparatus of FIGS. 6–8.

The apparatus of FIG. 2 for converting a non-condensed (expanded) sign or unsigned external signal, having a format as illustrated in FIG. 1(a) or 1(b), includes a buffer register A having a first section or part MQ and a second section or part AC, respectfully responsive to the first and second words of numeral representing signals having either of the formats illustrated in FIG. 1(a) or FIG. 1(b). In the specific circuit illustrated in FIG. 2, a signal having the data coding format of FIG. 1(a) is supplied to buffer register A. Each of sections MQ and AC of buffer register A is divided into eight segments, each of which can store a multiplet, i.e. plural bits; in the preferred embodiment, each multiplet is a quartet, i.e. includes four binary bits. The second, fourth, sixth and eighth segments of part MQ are respectfully responsive to numeral representing quartets $d_0$, $d_1$, $d_2$ and $d_3$ of the first word in the format of FIG. 1(a), while the second, fourth, sixth and eighth segments of portion AC are respectively responsive to numeral representing signal quartets $d_4$, $d_5$, $d_6$ and $d_7$. The odd numbered segments of part MQ are respectively responsive to the four zone quartets Z of the first word in the signal format of FIG. 1(a), while the first, third and fifth segments of part AC are respectively responsive to the three quartets in the zones Z preceeding quartets $d_4$, $d_5$ and $d_6$. For the non-condensed external data coding format of FIG. 1(a), the sign quartet S is supplied to the seventh segment in part AC of buffer register A. If the data format of FIG. 1(b) were employed, the quartet in zone Z preceeding quartet $d_7$ would be supplied to the seventh segment of part AC.

For the data coding format of FIG. 1(a), the sign of quartet S is tested by supplying the quartet in the seventh segment of part AC of buffer register A to AND gate $ET_1$, having an enable input responsive to a microinstruction signal DECIN. Microinstruction DECIN is derived from a microinstruction source of the central processing unit. Microinstruction DECIN is an instruction to enable the numeral representing signal in the external non-condensed data coding format to be converted into a signal in the internal signless non-condensed data coding format. In response to AND gate $ET_1$ being enabled by signal DECIN, the sign indicating quartet in the seventh segment of part AC of buffer register A is coupled in parallel to extension EA of part AC of buffer register A and to error checking circuit CS. Error checking circuit CS is enabled by microprogram control signal DECIN to enable a comparison to be made with four binary bits representing signed codes of the external signals supplied by bus I to buffer register A. To this end, error checking circuit CS includes four comparators, one for each of the bits of the sign quartet. In response to any of the bits in the sign quartet derived from the seventh segment of part AC differing from the predetermined sign indicating bits supplied to error checking network CS, the error checking network derives an error signal ER. Error indicating signal ER is supplied by checking circuit CS to the microprogram source of the central processing unit, to trigger a microprogram that tests the central processing unit.

The apparatus of FIG. 2 also includes a multiplexer or gate circuitry MX having several segments, each responsive to a different quartet and capable of handling four bits simultaneously. The stages of multiplexer MX are respectively responsive to the sign indicating quartet in extension EA of part AC of buffer register A, as well as quartets $d_0$, $d_1$, $d_2$ and $d_3$ in segment MQ and quartets $d_4$, $d_5$, $d_6$ and $d_7$ in part AC. Thus, multiplexer MX is responsive to the quartets expressing numerals of the signal received by the data processing system in the external non-condensed code, as well as the sign indicating quartet. The several segments of multiplexers MX simultaneously derive four bit output quartets on internal bus P of the central processing unit in response to signals in microinstruction signal DECIN; the quartets on bus P are coupled to an operator register (not shown in FIG. 2) of the central processing unit under the control of microprogram signal DECIN. Because the sign quartet stored in segment S is coupled by multiplexer MX to the operator register on bus P by way of extension EA, the microprogram signal which controls the multiplexer can test the sign of the result obtained during arithmetic operations performed by the central processing unit of which the apparatus is a part.

Reference is now made to FIG. 3 of the drawing wherein there is illustrated a block diagram of an apparatus in accordance with the invention for converting a thirty two bit external numeral representing word on bus I having a signed condensed format into an internal signal having a condensed signless data coding format. The apparatus of FIG. 3 is an internal portion of a central processing unit including the same types of elements described supra in connection in FIG. 2.

The apparatus of FIG. 3 is, in many aspects, similar to that of FIG. 2. In FIG. 3, however, the buffer register includes only eight sections, each of which stores one quartet. The sign indicating quartet in the signal on bus I having the format of FIG. 1(c) is supplied to the eighth segment S of buffer register part AC, while numeral representing quartets $d_0$–$d_5$ of the signal on bus I are respectively applied to the second through seventh segments of register part AC. The zero quartet of the signal on bus I, including four binary zero bit values, is supplied to the first segment of part AC.

The sign indicating signal quartet stored in the last segment of part AC is selectively coupled through AND gate $ET_2$ in response to a microinstruction DECIN associated with the code conversion which is to be performed. The four bit signal coupled through AND gate $ET_2$ is supplied in parallel to error checking circuit CS and to four bit, quartet extension EA of register part AC. Error checking circuit CS responds to microinstruction DECIN to determine if the sign quartet coupled to it through gate $ET_2$ corresponds with a designated sign for the external signal, as can be indicated by the microinstruction. Signal ER is derived by error checking circuit CS in response to the error checking circuit detecting an error in the sign while being enabled by microinstruction DECIN.

The apparatus of FIG. 3 includes eight segment multiplexer or gate array MX; each segment is simultaneously responsive to a quartet. The quartets supplied to the eight segments of multiplexer MX are simultaneously coupled to a thirty two bit internal bus P of multiplexer MX under the control of microinstruction DECIN supplied to the multiplexer. The first segment of multiplexer MX, FIG. 3, is responsive to the four bits in extension EA of buffer register part AC. The remaining seven segments of multiplexer MX are connected to the quartets stored in the first through seventh segments of buffer register part AC.

Reference is now made to FIG. 4 of the drawing wherein there is illustrated a block diagram of an apparatus included in a central processing unit for coupling an external, signless, condensed data coding format signal into an internal signal having the same format. The thirty two bit word on bus I is coupled into buffer register part AC that includes eight, four bit octet segments for storing quartets $d_0$–$d_7$ as a signal having the format illustrated in FIG. 1(f). The same multiplexer MX is provided in the apparatus of FIG. 4 and in the apparatus of FIG. 3 and thereby includes eight four bit quartets. Corresponding numbered quartets in the segments of buffer register part AC are coupled to the segments of multiplexer MX. Multiplexer MX is responsive to microinstruction DECIN to selectively couple all of the four bit quartets derived from buffer register AC simultaneously to thirty two bit internal bus P.

Reference is now made to FIG. 5 of the drawing, a block diagram of a device, in accordance with the invention, within a central processing unit which is a synthesis of FIGS. 2-4. The apparatus of FIG. 5 can process signals supplied by input bus I to the central processing unit in any of the external data coding formats of FIGS. 1(a)–1(f) and can manipulate these formats so that they are always in the internal data coding format of FIG. 1(f).

The apparatus of FIG. 5 includes buffer register A having parts AC and MQ, as well as extension EA and multiplexer or gate array MX, in combination with sign checking circuit CS and gates $ET_1$ and $ET_2$ associated therewith. Sign checking circuit CS and multiplexer MX are controlled by predetermined signals of microinstruction DECIN derived from a microprogram of the central processing unit of which the converter illustrated in FIG. 5 is a part. The different microinstructions control multiplexer MX, as well as gates $ET_1$ and $ET_2$ to enable signals having the formats of FIGS. 1(a)–1(f) to be coupled to bus P with the format of FIG. 1(f). Because the operation of buffer register A, multiplexer MX, as well as gates $ET_1$ and $ET_2$ and sign checking circuits CS, has been described supra in connection with FIGS. 2–4, there is no need to describe this operation again. The thirty two bit word supplied to bus P by multiplexer MX is supplied by way of thirty two bit bus $S_1$ to operator register OPREG in a conventional manner, to control the central processing unit.

The apparatus of FIG. 5 includes further features, not discussed supra, in connection with FIGS. 2–4. In particular, the apparatus of FIG. 5 is capable of: (1) checking on the length of each signal converted into the internal code, i.e. determining the number of numeral representing quartets supplied by multiplexer MX to bus P; and (2) comparing each numeral representing quartet converted into the internal code with a predetermined value.

The length of each signal expressed in the internal code on bux P is determined by eight different comparison elements in comparator $C_1$. Each element in comparator $C_1$ compares the value of each quartet derived from multiplexer MX with the value of a quartet formed exclusively of binary zero values. Such a comparison enables quartets derived from multiplexer MX to be recognized as quartets having a zero value. It is necessary to detect quartets having a zero value, if the external signal on bus I has the condensed format having a sign, (FIG. 1(c)) or the signless condensed format (FIG. 1(e))0. In the data formats of FIGS. 1(c) and 1(e), the first and third quartets respectively have zero values to complete the octets of quartets and to define that an even or odd number of quartets form the signal. If the external signal supplied to the central processing unit on bus I has the format of FIG. 1(c) or FIG. 1(d), the first and third quartets in bus P should have zero values if the conversions from external to internal data coding format were properly executed.

The eight quartets derived from multiplexer MX are supplied in parallel to the elements in comparator $C_1$. Each element in comparator $C_1$ compares the four bits in each quartet supplied to it by multiplexer MX with four bits, each having a binary zero value, supplied to it in response to the microinstruction. In response to each quartet supplied by multiplexer MX to comparator $C_1$ having other than a binary zero value, the comparator derives a binary 1 bit for that quartet. Comparator $C_1$ thereby derives an output signal including eight parallel binary bits, one for each of the numeral representing quartets derived from multiplexer MX.

The eight binary bits derived from comparator $C_1$ are applied to multiplexer MXL, having a control input responsive to microinstruction DECIN. The microinstruction DECIN indicates which of the formats of FIGS. 1(a)–1(f) is supplied to bus I and therefore whether the signal derived from multiplexer MX is derived in response to an external signal having a condensed or non-condensed coding format, the number of quartets in the signal in the external signal on bus I and whether there is an even or odd number of numeral representing quartets rather than a sign, in the signal on bus I. In response to microinstruction DECIN indicating that the external signal on bus 1 has a format of the type illustrated in FIG. 1(c), multiplexer MXL is activated to respond to the signal derived from the element in comparator $C_1$ responsive to the zero indicating, first quartet derived from the first segment of multiplexer MX. Thereby, multiplexer MXL respectively derives binary zero and one signals in response to the first quartet derived from multiplexer MX having zero and other than zero values. In response to the signal on bus I having a format of the type illustrated in FIG. 1(e), microinstruction DECIN commands multiplexer MXL to be responsive to the element of comparator $C_1$ responsive to the third quartet in signal P, as derived from the third segment of multiplexer MX. Thereby, multiplexer MXL derives a binary zero signal in response to the third quartet derived from multiplexer MX being a zero; multiplexer MXL derives a binary 1 signal in response to the third quartet of signal P having a value other than zero.

Multiplexer MXL also responds to microinstruction DECIN to determine if an even number of numeral representing quartets is derived from multiplexer MX in response to the external signal on bus I, i.e. if the signal derived from the multiplexer has the format indicated in any of FIGS. 1(a), 1(b), 1(c) or 1(f). In particular, for the formats of FIGS. 1(a), 1(b) and 1(f), the elements in comparator $C_1$ determine if at least one bit of each of eight quartets derived by multiplexer MX has a binary one value. To this end, microinstruction DECIN supplies a binary one signal to each of the elements in comparator $C_1$ when the output of multiplexer MX is being tested to determine if it is deriving a signal having the format of any of FIGS. 1(a), 1(b) or 1(f). In response to a binary 1 value existing in any of these quartets, a binary zero signal is derived from multiplexer MXL. To test the format of FIG. 1(c), the elements in comparator $C_1$ are again supplied with binary one signals by microinstruction DECIN and multiplexer MXL responds to microinstruction DECIN to pass the output of the elements in comparator $C_1$ which are responsive to the second through seventh quartets derived from multiplexer MX, to the exclusion of the first and eight quartets. The first and eighth quartets are not coupled through multiplexer MXL because they represent values of zero and the sign of the character in the format of FIG. 1(c). For the signals on bus P which are derived in response to external signals on bus I having the format of FIG. 1(d) or 1(e), multiplexer MXL responds to microinstruction DECIN to pass quartets $d_0$–$d_4$; for the format of FIG. 1(d), multiplexer MXL is activated so that the elements of comparator $C_1$ associated with the third through seventh quartets derived from multiplexer MX are coupled to multiplexer MXL. For the format of FIG. 1(e), the elements of comparator $C_1$ associated with the fourth through eighth quartets derived from multiplexer MX are coupled through the multiplexer. In this manner, it is possible to determine whether the quartets supplied to comparator $C_1$ by multiplexer MX have the correct values in the correct places, have the correct length, and if they are correctly even or odd in number.

The several possible outputs of multiplexer MXL are coupled together by a wired OR gate (not shown). The output signal of the wired OR gate is coupled to one input of OR gate OU which derives an output signal ERT. A binary one value for signal ERT indicates that an error has occurred in the conversion of the external signal to the internal signal. The signal derived from OR gate OU triggers a microprogram source which tests the central processing unit in response to the output of multiplexer MXL indicating that the zero value of the quartet is absent or does not occupy the correct position in the species of quartets derived from multiplexer MX.

A further feature of the invention assures that all numeral representing signals derived from multiplexer MX have values less than 10. Of course, in ASCII, the only decimal values which can be represented are the numerals 0-9, in turn represented by the binary values 0000-1001. To perform such a comparison, a comparator $C_2$ is provided. Comparator $C_2$ includes eight elements, one for each of the octets derived by multiplexer MX. Each of the eight elements included within comparator $C_2$ assures that each quartet has a decimal value of less than 10, i.e., a binary value less than 1010. In response to the quartets supplied to each element within comparator $C_2$ having a value less than the binary value 1010 the element derives a binary one level. The eight binary signals derived from the elements in comparator $C_2$ are supplied to NAND gate NONET. In response to all of the signals supplied by comparator $C_2$ to NAND gate NONET having a binary one value, the NAND gate derives a binary zero signal to indicate that no error occurred in transforming the external numerical representing signal into an internal signal.

The output of NAND gate NONET is supplied to OR gate OU. OR gate OU is also responsive to signal ER, as derived from previously discussed sign checking circuit CS. In response to an error in the conversion operation being detected by multiplexer MXL, NAND gate NONET, or the sign quartet having an incorrect value, OR gate OU derives error signal ERT.

The converted signals derived by a multiplexer MX on bus P are supplied to operation register OPREG via bus $S_1$, as described supra.

Reference is now made to FIGS. 6, 7 and 8, schematic block diagrams of circuitry within the central processing unit for converting internal signless condensed data coding formats for numeral indicating characters, as illustrated in FIG. 1(f), to signals which represent numerals in various of the external codes illustrated in FIGS. 1(a)-1(f). Each of the circuits illustrated in FIGS. 6, 7 and 8 is internal to the central processing unit.

FIG. 6 is a block diagram of a converter of numeral representing signals derived internally of the central processing unit in a signless condensed data coding format into an external condensed data coding format having a sign. The apparatus of FIG. 6 includes a buffer register AC' containing eight segments, each of which stores a quartet of binary bits. Buffer register AC' includes an extension EA' having a four bit, i.e., one quartet, capacity. The eight segments of buffer register AC' store the quartets associated with the numeral representing signal derived by the remainder of the central processing unit, while extension EA' stores a sign representing quartet S. The converter of FIG. 6 also includes a multiplexer i.e., gate, MX' controlled by binary signals in microinstruction DECOUT. Microinstruction DECOUT is derived by a microinstruction source of the central processing unit for controlling the internal/external code conversion. Multiplexer MX' includes eight segments, each having a one quartet capacity. Output signals from the second through eighth segments of buffer register AC' are coupled to the first through seventh segments of multiplexer MX' under the control of microinstruction DECOUT. Thereby, the seven quartets stored in buffer register AC' having the most significant decimal values are coupled to the first seven segments, i.e., seven most significant place segments, of multiplexer MX'. The sign representing quartet in extension EA' is supplied to the least significant place segment of multiplexer MX'. The signal supplied to the eight segments of multiplexer MX' by the segments of buffer AC' and extension EA' thereof are simultaneously read out of the multiplexer to bus A and apparatus external to the central processing unit, e.g. a terminal or other peripheral, in response to microinstruction DECOUT being applied to the multiplexer.

Reference is now made to FIG. 7 of the drawing wherein there is illustrated a schematic block diagram of apparatus included within the central processing unit for converting internal numeral representing signals having a signless condensed data coding format, as illustrated in FIG. 1(f), into a signal having a non-condensed data coding format with a sign, as illustrated in FIG. 1(a), or without a sign, as illustrated in FIG. 1(b). The internal signless condensed format signal is stored in eight segment buffer register AC', having the same characteristics as buffer register AC' of FIG. 6. In addition, the sign of the numerical value associated with the internally derived signal is stored in extension EA' of buffer register AC', as described in connection with FIG. 6.

To enable a signal having a non-condensed data coding format to be derived, the apparatus of FIG. 7 includes a multiplexer or gating circuit MX", having sixteen segments, each of which has a capacity of four bits, i.e., a single quartet. The sixteen segments of multiplexer MX" are supplied in parallel to sixty four bit bus A in response to derivation of microinstruction DECOUT from a suitable microinstruction source that controls the internal/external code conversion.

The eight quartets in buffer AC' of FIG. 7 are supplied to alternate segments of multiplexer MX". In particular, the quartet stored in the first segment of buffer AC' is supplied to the second segment of multiplexer MX", the quartet in the second segment of buffer AC' is supplied to the fourth segment of multiplexer MX", the quartet in the third segment of buffer AC' is supplied to the sixth segment of multiplexer MX", etc., whereby the quartet in the last segment of buffer AC' is supplied to the sixteenth segment of multiplexer MX". Thereby, quartets representing decimal values of a character are supplied by buffer AC" to alternate, even numbered segments of multiplexer MX". With the coding format of FIG. 1(b), the odd numbered segments of multiplexers MX" are loaded in response to microinstruction DECOUT with quartets representing zone positions of a character corresponding to a selected external data coding format, for example of the ASCII or EBCDIC type. Alternatively, if the data coding format of FIG. 1(a) is to be supplied to the external device, the even numbered segments 1-13, inclusive, of multiplexer MX" are loaded with quartets representing zone positions of a character in the selected external data coding format, of the ASCII or EBCDIC type. For the external data coding format of FIG. 1(a), the sign indicating quartet stored in extension EA' is supplied to the fifteenth segment of multiplexer MX" in response to microinstruction DECOUT.

To these ends, AND gate arrays $ET_1'$ and $ET_2'$ are provided. Each of arrays $ET_1'$ and $ET_2'$ includes four AND gates, one for each of the bits that can be supplied to the fifteenth segment S of multiplexer MX". The AND gates of array $ET_1'$ are responsive to a first microinstruction in source DECOUT to feed a character representing quartet to the fifteenth segment S of multiplexer MX" when the external code derived on bus A has a format as illustrated in FIG. 1(b). In response to microinstruction DECOUT indicating that the external code to be supplied to bus A has the format illustrated in FIG. 1(a), a microinstruction controls gate array $ET_2'$, to enable the sign indicating quartet in buffer extension EA' to be supplied to multiplexer extension S.

The quartet coupled through the penultimate or fifteenth segment S of multiplexer MX" is supplied to an external apparatus, such as a terminal, as the penultimate least significant quartet.

Reference is now made to FIG. 8 of the drawing, a schematic block diagram of an apparatus included in the central processing unit for converting the internal signless condensed format signal into an external signal having the identical format. In other words, the apparatus of FIG. 8 converts the signal of FIG. 1(f) into an identical signal.

The apparatus of FIG. 8 includes buffer register AC' and multiplexer MX', with identical constructions as discussed in connection with FIG. 6, except that no extension EA' for buffer AC' is necessary. Corresponding segments of buffer register AC' are connected to corresponding segments of multiplexer MX'. The signals stored in buffer register AC' are coupled through multiplexer MX' to a bus A (not shown) in response to signals in microinstruction DECOUT.

It is noted that the structures of FIGS. 6 and 8 could be formed as a portion of the structure of FIG. 7, wherein one half of multiplexer MX' in FIG. 7 is utilized as multiplexer MX' in either of FIGS. 6 and 8.

While there have been described and illustrated several specific embodiments of the invention, it will be clear that variations in the details of the embodiments specifically illustrated and described may be made without departing from the true spirit and scope of the invention as defined in the appended claims.

We claim:

1. Apparatus for converting numeric representing characters derived by a data processing system externally of a data processor unit into numeric characters processed internally in the unit, the external characters being coded in any of: (a) first and second successive multi-bit words, each including a like number (N) of multiplets, each including a like number (M) of bits, where N and M are integers greater than two, alternate multiplets of the first and second words representing numeric values having different significant bit positions, the remaining multiplets of the first word and all but one of the remaining multiplets of the second word representing numerical values in a given table representing numeric characters in a particular data coding format, the one remaining multiplet of the second word representing a sign allocated to the numeric value of the alternate multiplets of the first and second words, (b) third and fourth successive multi-bit words, each including a like number (N) of multiplets, each including a like number (M) of bits, wherein alternate multiplets of the third and fourth words represent numeric values having different significant bit positions, the remaining multiplets of the first and second words and all but one of the remaining multiplets of the second word representing numerical values in a given table representing numeric characters in a particular data coding format, (c) fifth multi-bit words, each including N multiplets each including M bits, (N-2) multiplets of the fifth words representing numeric values having different significant bit positions, a first remaining multiplet of the fifth words representing the sign of the fifth words, the second remaining multiplet of the fifth words completing the fifth words, (d) sixth multi-bit words, each including R multiplets each including M bits, where R is less than N, one multiplet of the sixth words representing the sign of the sixth words having the same position as the first remaining multiplet of the fifth words, the remaining multiplets of the sixth words representing numeric values having different signficant bit positions; the internal characters being coded in multi-bit words each including N multiplets each including M-bits, each multiplet of the internal code representing a numeric character having a different significant bit position, the converting apparatus comprising: first buffer register means internal of the data processor unit responsive to the externally derived characters, the first buffer register means including first and second sections, each section including N segments, each segment storing M bits, the first section being responsive to the first, third, fifth and sixth words, the second section being responsive to the second and fourth words segments A, B . . . D of the first section being responsive to the alternate multiplets of the first and third words, segments E, F . . . H of the second section being responsive to the alternate multiplets of the second and fourth words, segments I, J . . . L of the first section being responsive to the remaining multiplets of the first and third words, segments B . . . D, I, J . . . L of the first section being responsive to the (N-2) multiplets of the fifth words and the R multiplets of the sixth word, segment A of the first section being responsive to the second remaining multiplet of the fifth words, (R-1) of segments A, B . . . D of the first section being responsive to the remaining multiplets of the sixth words, segment P of the first section being responsive to the sign representing multiplets of the fifth and sixth words, segment Q of the second section being responsive to the sign representing multiplet of the second word, a first multiplexer having N segments with input terminals connected to output terminals of the N segments of the first and second buffer register sections, each segment of the first multiplexer handling M bits simultaneously, an M bit error checking network responsive to an M bit signal indicative of the sign of the character being converted, first and second gate means respectively connected between output terminals of segments P and Q and input terminals of the checking network for selectively coupling the M bits of segments P and Q to M input terminals of the checking network, an operation register of the processor having M×N input terminals connected to M×N output terminals of the N segments of the multiplexer, the processor unit including a control source for controlling connections between output terminals of the first buffer register means and the M×N input terminals of the operation register via the N segments of the first multiplexer and segments P and Q of the checking network via the first and second gate means so that when:

(a) the first and second words are simultaneously converted (1) the alternate multiplets in segments, A, B . . . D of the first section and in segments E, F . . . H of the second section are simultaneously coupled via the multiplexer to the operation register to the exclusion of the multiplets in the remaining segments of the first and second sections and (2) the sign representing multiplet in segment Q of the second section is coupled via the second gate means to the checking network, (b) the third and fourth words are simultaneously converted the alternate multiplets in segments A, B . . . D of the first section and in segments E, F . . . H of the second section are simultaneously coupled via the multiplexer to the operation register to the exclusion of the multiplets in the remaining segments of the first and second sections;

(c) the fifth words are converted (1) the multiplets in segments A, B . . . D, I, J . . . L in the first section are simultaneously coupled via the N segments of the multiplexer to the operation register to the exclusion of the multiplets in the remaining segments of the first and second sections and (2) the multiplet in segment P of the first section is coupled via the first gate means to the checking network;

(d) the sixth words are converted (1) the multiplets in the (R−1) segments A, B . . . D of the first section are coupled via (R−1) segments of the multiplexer to the operation register to the exclusion of the multiplets in the remaining segments of the first and second sections, and (2) the multiplet in segment P of the first section is coupled via the first gate means to the checking network.

2. The apparatus of claim 1 further including means for determining if (a) a predetermined segment of the sixth words supplied by the N segments of the multiplexer to the operation register has a predetermined value, (b) any of the segments of the first and second words supplied by the N segments of the multiplexer to the operation register has a predetermined value, (c) any of the segments of the third and fourth words supplied by the N segments of the multiplexer to the operation register has a predetermined value, and (d) the (R−2) segments of the fifth word supplied by the (R−2) segments of the multiplexer to the operation register has a predetermined value.

3. The apparatus of claim 2 further including means for determining if the segments of the words supplied by the N segments of the multiplexer to the operation register have a value associated with the decimal values 0-9.

4. The apparatus of claim 1 further including means for determining if the segments of the words supplied by the N segments of the multiplexer to the operation register have a value associated with the decimal values 0-9.

5. Apparatus for converting numeric representing characters derived by a data processing system externally of a data processor unit into numeric characters processed internally in the unit, the external characters being coded in any of: (a) first and second successive multi-bit words, each including a like number (N) of multiplets, each including a like number (M) of bits, where N and M are integers greater than two, alternate multiplets of the first and second words representing numeric values having different significant bit positions, the remaining multiplets of the first word and all but one of the remaining multiplets of the second word representing numerical values in a given table representing numeric characters in a particular data coding format, the one remaining multiplet of the second word representing a sign allocated to the numeric value of the alternate multiplets of the first and second words, (b) third and fourth successive multi-bit words, each including a like number (N) of multiplets, each including a like number (M) of bits, wherein alternae multiplets of the third and fourth words represent numeric values having different signficant bit positions, the remaining multiplets of the first and second words and all but one of the remaining multiplets of the second word representing numerical values in a given table representing numeric characters in a particular data coding format, (c) fifth multi-bit words, each including N multiplets each including M bits, (N−2) multiplets of the fifth words representing numeric values having different significant bit positions, a first remaining multiplet of the fifth words representing the sign of the fifth words, the second remaining multiplet of the fifth words completing the fifth words, (d) sixth multi-bit words, each including R multiplets each including M bits, where R is less than N, one multiplet of the sixth words representing the sign of the sixth words having the same position as the first remaining multiplet of the fifth words, the remaining multiplets of the sixth words representing numeric values having different significant bit positions; the internal characters being coded in multi-bit words each including N multiplets each including M bits, each multiplet of the internal code representing a numeric character having a different significant bit position, the converting apparatus comprising: first buffer register means internal of the data processor unit responsive to the externally derived characters, the first buffer register means including first and second sections, each section including N segments, each segment storing M bits, the first section being responsive to the first, third, fifth and sixth words, the second section being responsive to the second and fourth words, segments A, B . . . D of the first section being responsive to the alternate multiplets of the first and third words, segments E, F . . . H of the second section being responsive to the alternate multiplets of the second and fourth words, segments I, J . . . L of the first section being responsive to the remaining multiplets of the first and third words, segments B . . . D, I, J . . . L of the first section being responsive to the (N−2) multiplets of the fifth words and the R multiplets of the sixth word, segment A of the first section being responsive to the second remaining multiplet of the fifth words, (R−1) of segments A, B . . . D of the first section being responsive to the remaining multiplets of the sixth words, segment P of the first section being responsive to the sign representing multiplets of the fifth and sixth words, segments Q of the second section being responsive to the sign representing multiplet of the second word, a first multiplexer having N segments with input terminals connected to output terminals of the N segments of the first and second buffer register sections, each segment of the first multiplexer handling M bits simultaneously, the multiplexer including an M bit extension segment, first and second gate means respectively connected between output terminals of segments P and Q and input terminals of the extension segment for selectively coupling the M bits of segments P and Q to M input terminals of the extension segment, an operation register of the processor having M×N input terminals connected to M×N output terminals of the N segments of the multiplexer, the processor unit including a control source for controlling connections between output terminals of the first buffer register means and the M×N input terminals of the operation register via the N segments of the first multiplexer and segments P and Q of the extension segment via the first and second gate means so that when:

(a) the first and second words are simultaneously connected (1) the alternate multiplets in segments A, B . . . D of the first section and in segments E, F . . . H of the second section are simultaneously coupled via the multiplexer to the operation register to the exclusion of the multiplets in the remaining segments of the first and second sections and (2) the sign representing multiplet in segment Q of the second section is coupled via the second gate means to the extension segment and thence to the operation register, (b) the third and fourth words are simultaneously converted the alternate multiplets in segments A, B . . . D of the first section and in segments E, F . . . H of the second section are simultaneously coupled via the multiplexer to the operation register to the exclusion of the multiplets in the remaining segments of the first and second sections;

(c) the fifth words are converted (1) the multiplets in segments A, B . . . D, I, J . . . L in the first section are simultaneously coupled via the N segments of the multiplexer to the operation register to the exclusion of the multiplets in the remaining segments of the first and second sections and (2) the multiplets in segment P of the first section are coupled via the first gate means to the extension segment and thence to the operation register;

(d) the sixth words are converted (1) the multiplets in the (R−1) segments A, B . . . D of the first section are coupled via (R−1) segments of the multiplexer to the operation register to the exclusion of the multiplets in the remaining segments of the first and second sections, and (2) the multiplets in segment P of the first section are coupled via the first gate means to the extension segment.

6. The apparatus of claim 5 further including an M bit error checking network responsive to an M bit signal indicative of the sign of the character being converted, the first and second gate means being connected to input terminals of the checking network for selectively coupling the M bits of segments P and Q and M input terminals of the checking network so that when: (a) the first and second words are simultaneously converted the sign representing multiplet in segment Q of the second section is coupled via the second gate means to the checking network, (b) the fifth and sixth words are converted the multiplets in segment P of the first section is coupled via the first gate means to the checking network.

7. The apparatus of claim 6 further including means for determining if (a) a predetermined segment of the sixth words supplied by the N segments of the multiplexer to the operation register has a predetermined value, (b) any of the segments of the first and second words supplied by the N segments of the multiplexer to the operation register has a predetermined value, (c) any of the segments of the third and fourth words supplied by the N segments of the multiplexer to the operation register has a predetermined value and (d) the (R−2) segments of the fifth word supplied by the (R−2) segments of the multiplexer to the operation register has a predetermined value.

8. The apparatus of claim 7 further including means for determining if the segments of the words supplied by the N segments of the multiplexer to the operation register have a value associated with the decimal values 0-9.

9. The apparatus of claim 6 further including means for determining if the segments of the words supplied by the N segments of the multiplexer to the operation register have a value associated with the decimal values 0-9.

* * * * *